United States Patent
Gutgold et al.

(10) Patent No.: US 9,551,440 B2
(45) Date of Patent: Jan. 24, 2017

(54) CABLE MANAGEMENT CLASP FOR A CABLE ASSEMBLY OF A COMMUNICATION SYSTEM

(71) Applicant: Tyco Electronics Corporation, Berwyn, PA (US)

(72) Inventors: Glen Gutgold, Harrisburg, PA (US); Tracy Lee Smith, Harrisburg, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 0 days.

(21) Appl. No.: 14/693,186

(22) Filed: Apr. 22, 2015

(65) Prior Publication Data
US 2016/0312919 A1 Oct. 27, 2016

(51) Int. Cl.
*F16L 3/223* (2006.01)
*H02G 15/06* (2006.01)

(52) U.S. Cl.
CPC ............. *F16L 3/2235* (2013.01); *H02G 15/06* (2013.01)

(58) Field of Classification Search
USPC ......................................................... 174/135
See application file for complete search history.

(56) References Cited

U.S. PATENT DOCUMENTS

| | | | | |
|---|---|---|---|---|
| 3,421,187 A | * | 1/1969 | Ryder | F16L 3/2235 248/74.3 |
| D234,204 S | * | 1/1975 | Miller | 24/487 |
| 3,906,592 A | * | 9/1975 | Sakasegawa | F16L 3/1233 24/487 |
| D311,487 S | * | 10/1990 | Platt | D8/356 |
| 5,115,542 A | * | 5/1992 | Gehres | F16L 3/2235 24/339 |
| 5,234,185 A | * | 8/1993 | Hoffman | F16L 5/14 248/56 |
| 5,263,671 A | * | 11/1993 | Baum | B62J 11/00 24/543 |
| D468,996 S | | 1/2003 | Sarkinen et al. | |
| 6,768,858 B2 | | 7/2004 | Tinucci et al. | |
| 7,380,758 B2 | * | 6/2008 | Hauser | F16L 3/2235 248/68.1 |
| D676,314 S | * | 2/2013 | Cude | D8/396 |
| 2004/0235344 A1 | * | 11/2004 | Kleeberger | H01R 13/6215 439/540.1 |
| 2007/0235597 A1 | | 10/2007 | Winchester | |
| 2009/0065249 A1 | | 3/2009 | Silvers | |

* cited by examiner

*Primary Examiner* — Michael F McAllister

(57) ABSTRACT

A cable management clasp includes a clasp body having an upper locating member and a lower locating member joined to the upper locating member at opposite first and second ends. The upper and lower locating members are parallel to each other to form an elongated cable receptacle between the upper and lower locating members. The upper and lower locating members gang a plurality of cables in a parallel arrangement within the cable receptacle.

20 Claims, 2 Drawing Sheets

CABLE MANAGEMENT CLASP FOR A CABLE ASSEMBLY OF A COMMUNICATION SYSTEM

BACKGROUND

The subject matter herein relates generally to cable management clasps for a cable assembly of a communication system.

Various communication systems may include an array of electrical connectors for interconnecting different communication devices. The electrical connectors are electrically connected by cables to communicatively couple the corresponding electrical connectors. However, management of the cables, particularly in high density applications or in applications having limited space between the electrical connectors is problematic. For example, the various cables may be twisted, intertwined or otherwise difficult to manage. As the number of electrical connectors and the associated cables increases, it can be more difficult to route and manage the cables within the allotted space.

Accordingly, a need remains for a mechanism or device that facilitates managing the cables between the arrays of electrical connectors.

BRIEF DESCRIPTION

In an embodiment, a cable management clasp is provided including a clasp body having an upper locating member and a lower locating member joined to the upper locating member at opposite first and second ends. The upper and lower locating members are parallel to each other to form an elongated cable receptacle between the upper and lower locating members. The upper and lower locating members gang a plurality of cables in a parallel arrangement within the cable receptacle.

In another embodiment, a cable management clasp is provided including an upper locating member having an interior surface and an exterior surface. The interior surface has a plurality of scallop-shaped projections forming a series of cradles. The cradles are configured to receive corresponding cables. The upper locating member has a first hook end forming a first cup configured to wrap around a first end cable of the cables. The upper locating member has a first mating end opposite the first hook end. The cable management clasp includes a lower locating member having an interior surface and an exterior surface. The interior surface has a plurality of scallop-shaped projections forming a series of cradles. The cradles cooperate with the cradles of the upper locating member to receive corresponding cables. The lower locating member has a second hook end forming a second cup configured to wrap around a second end one of the cables. The lower locating member has a second mating end opposite the second hook end. The second hook end nests with the first mating end and the second mating end nests with the first hook end to form a continuous clasp body around the cables. The upper and lower locating members gang the cables in a parallel arrangement with the cradles of the upper and lower locating members holding the relative positions of the cables.

In a further embodiment, a cable assembly is provided including first and second contact modules that each include contacts and a plurality of cables extending between the first and second contact modules electrically coupling the contacts of the first contact module to the corresponding contacts of the second contact module. The cables extend parallel to one another and are coplanar at the first contact module and are coplanar at the second contact module. The cable assembly includes a cable management clasp coupled to the plurality of cables at a location between and separate from the first and second contact modules. The cable management clasp includes a clasp body having an upper locating member and a lower locating member joined to the upper locating member at opposite first and second ends. The upper and lower locating members are parallel to each other to form an elongated cable receptacle between the upper and lower locating members. The upper and lower locating members gang the cables such that the cables extend parallel to one another and are coplanar as the cables extend through the cable management clasp within the cable receptacle.

DETAILED DESCRIPTION

Figure 1:
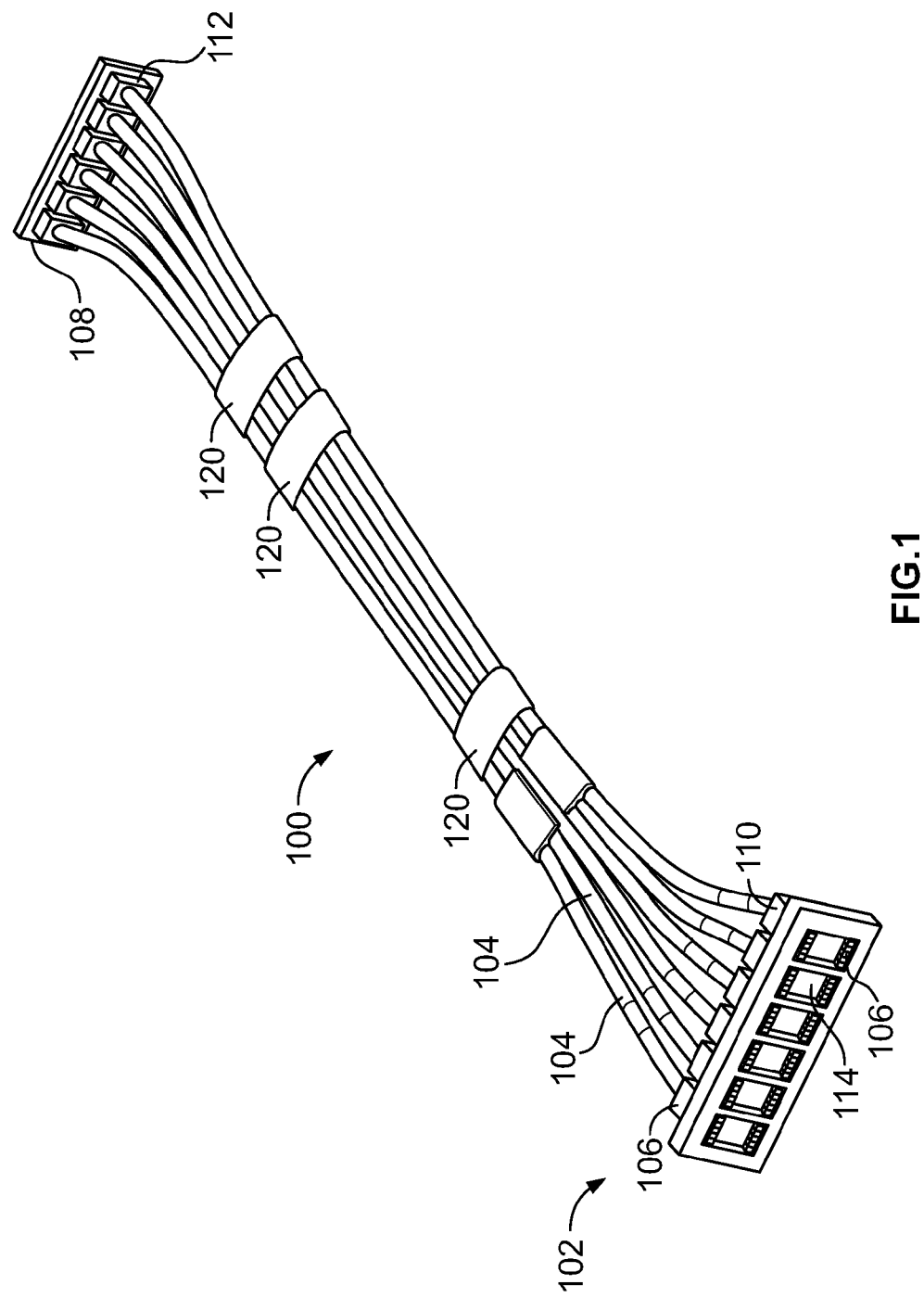
FIG. 1 is a front perspective view of a communication system formed in accordance with an embodiment.

Embodiments set forth herein may include communication systems or rack systems or sub-systems, which are hereinafter referred to generally as rack systems. In some embodiments, a plurality of rack systems may be stacked side-by-side to construct a communication system. In other embodiments, a communication system may include a single rack system. The communication systems may be, for example, cable backplane systems or cable midplane systems. Various embodiments include electrical connectors that are interconnected to other electrical connectors through cables.

As used herein, a cable midplane system has at least a first array and a second array of electrical connectors. The electrical connectors of the first array may face in a direction that is opposite the electrical connectors of the second array. The first and second arrays may mate with daughter card assemblies. The electrical connectors of the first array may be communicatively coupled to the electrical connectors of the second array through cables that extend between the electrical connectors. More specifically, the cables extend through one or more cabling cavities that are defined by a support frame of the cable midplane system. Accordingly, the daughter card assemblies that mate with the first array may be communicatively coupled to the daughter card assemblies that mate with the second array.

As used herein, a cable backplane system has only a single array of electrical connectors or multiple arrays that face in a common direction. For example, all of the electrical connectors of the cable backplane system may be positioned along one side of a backplane and face in the same direction. The electrical connectors may be communicatively coupled to each other through cables that are positioned behind the backplane.

Embodiments may also include ribbon assemblies and cable organizers. The ribbon assemblies may be used to construct the various electrical connectors, such as the electrical connectors of the cable midplane and backplane systems described herein. The cable organizers may facilitate routing the cables of the ribbon assemblies and, in particular, locating twists of the ribbon assemblies within a cabling cavity. Although various elements, components, and features may be described with reference to a cable midplane system or to a cable backplane system, it should be understood that such elements, components, and features may also be applicable to other communication systems or devices. Accordingly, some embodiments are not limited to cable backplane or midplane systems.

As used herein, phrases such as "a plurality of [elements]" and "an array of [elements]" and the like, when used in the detailed description and claims, do not necessarily include each and every element that a component may have. Other elements may not include the recited feature. Accordingly, unless explicitly stated otherwise (e.g., "each and every [element]"), embodiments may include similar elements that do not have the recited features.

The communication systems may be used in various applications. By way of example only, the communication systems may be used in telecom and computer applications, routers, servers, supercomputers, and uninterruptible power supply (UPS) systems. One or more of the electrical connectors described herein may be similar to electrical connectors of the STRADA Whisper or Z-PACK TinMan product lines available through TE Connectivity. Other types of electrical connectors may be provided in alternative embodiments, such as RJ-45 jacks. For example, one or more of the electrical connectors may be capable of transmitting data signals at high speeds, such as 10 gigabits per second (Gb/s), 20 Gb/s, 30 Gb/s, or more. In more particular embodiments, one or more of the electrical connectors may be capable of transmitting data signals at 40 Gb/s, 50 Gb/s, or more. Each of the electrical connectors may include a high-density contact array that includes signal contacts. A high-density contact array may have, for example, at least 12 signal contacts per 100 $mm^2$ along a front end of the electrical connector. In more particular embodiments, the high-density contact array may have at least 15 signal contacts or at least 20 signal contacts per 100 $mm^2$ along the front end of the electrical connector.

FIG. 1 is a front perspective view of a portion of a communication system 100 formed in accordance with an embodiment. In an exemplary embodiment, the communication system 100 is a server system. In other embodiments, the communication system 100 may be a cable backplane system, a cable midplane system, or another type of cable communication systems. The communication system 100 includes a plurality of cable assemblies 102 having cables 104 interconnecting electrical connectors 106, 108. The electrical connectors 106, 108 may be arranged in first and second arrays, such as for mating with mating electrical connectors, such as cable connectors, circuit board connectors, circuit cards (for example, switch cards, line cards, daughtercards) and the like.

In the illustrated embodiment, the electrical connectors 106, 108 include contact modules 110, 112, respectively. The contact modules 110, 112 include contacts 114 used for electrical connection, such as with the mating electrical connectors. The cables 104 are electrically connected to corresponding contacts 114 and are used to electrically interconnect various electrical connectors, such as the electrical connector 106 with the electrical connector 108. The cables 104 may have multiple wires therein that are terminated to multiple contacts 114, which may be signal contacts, power contacts, ground contacts or other types of contacts. In other embodiments, each cable 104 may have a single wire terminated to a single contact, such as a coaxial cable. The cables 104 eliminate interconnections via traces of a circuit board, such as those that may be used in more conventional backplane communication systems. The electrical connectors 108, 110 and the cables 104 may have improved signal performance along the signal paths between various connectors of the communication system 100 as compared to conventional backplane communication systems. The cables 104 allow routing between various electrical connectors. Optionally, the cables 104 may interconnect contact modules of different electrical connectors. The contact modules 110, 112 may have a dielectric body that supports the contacts 114 and/or portions of the cables 104. For example, the dielectric body may be overmolded over portions of the contacts 114 and/or over portions of the cables 104. In other embodiments, the dielectric body may be a housing that holds the contacts 114.

In various embodiments, numerous electrical connectors 106, 108 may be provided in the communication system 100 and management of the cables 104 is important. The cables 104 may be arranged in arrays or bundles, which are groups of cables that may extend to/from a common contact module 110, 112. The cables 104 within each array extend generally parallel to one another as the cables 104 extend between the contact modules 110, 112. The cables 104 are separate or discrete such that the cables 104 are capable of moving independently. Thus, as the cables 104 extend further away from the contact module 110 (or the contact module 112), the cables 104 may be free to move relative to one another and thereby form cable gaps therebetween, which may be undesirable. For example, the cables 104 may bend away from each other, twist around each other and/or cables of another cable array, or overlap each other as the cables 104 extend between the contact modules 110, 112, which may make assembly of the communication system 100 difficult and time consuming.

In an exemplary embodiment, one or more cable management clasps 120 may be configured to maintain the relative positions among the cables 104 of the cable array, which may ease assembly and reduce assembly time. The cable management clasps 120 may be spaced apart along the cables 104. Optionally, the cable management clasps 120 may be oriented differently (for example, upside down) in some locations. The cables 104 are coplanar and extend parallel to one another at the contact module 110 and at the contact module 112. The cable management clasp 120 is used to hold the cables 104 in a similar coplanar and parallel arrangement at a location remote from the contact module 110 and the contact module 112. The cable management clasp 120 is coupled to the plurality of cables 104 at a location between and separate from the first and second contact modules 110, 112. The cable management clasp 120 is configured to hold the cables 104 in substantially fixed positions with respect to one another as the cables 104 extend through the cable management clasp 120.

Figure 2:
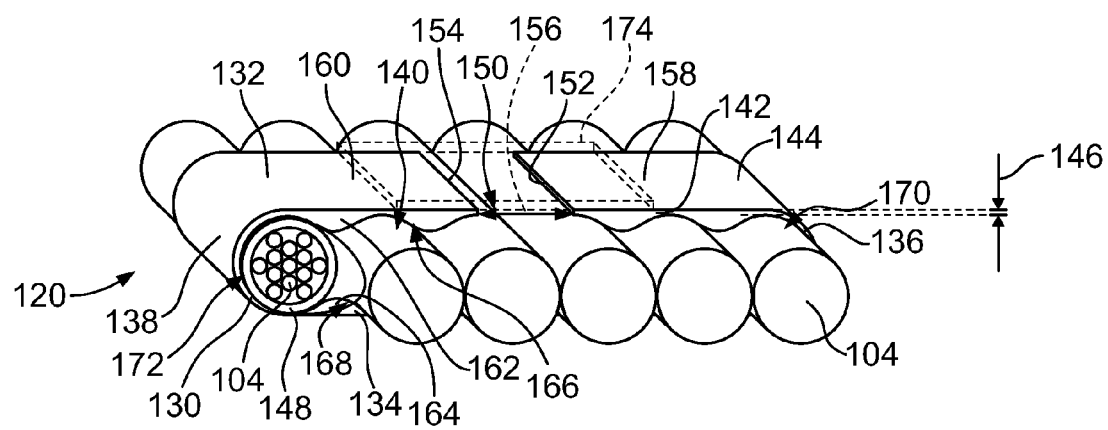
FIG. 2 is a top perspective view of a cable management clasp formed in accordance with an exemplary embodiment and holding a plurality of cables of the communication system.

FIG. 2 is a top perspective view of the cable management clasp 120 holding a plurality of the cables 104. The cable management clasp 120 includes a clasp body 130 having an upper locating member 132 and a lower locating member 134 joined to the upper locating member 132 at opposite first and second ends 136, 138. In an exemplary embodiment, the upper and lower locating members 132, 134, as well as the first and second ends 136, 138, are integrally formed as a single piece unitary structure. For example, the clasp body 130 may be molded from a plastic material as a unitary piece.

The upper and lower locating members 132, 134 are oriented parallel to each other to form an elongated cable receptacle 140 between the upper and lower locating members 132, 134. The upper and lower locating members 132, 134 gang a plurality of the cables 104 in a parallel arrangement within the cable receptacle 140. The upper locating member 132 spans above the cables 104 in the cable array and may span above each of the cables 104 in the cable array. The lower locating member 134 spans below each of the cables 104 in the cable array. The first and second ends 136, 138 wrap around the outermost cables 104. The cables 104 are captured between the upper and lower locating members 132, 134 and between the first and second ends 136, 138. In an exemplary embodiment, the cables 104 are tightly held by the clasp body 130 in the elongated cable receptacle 140, such as with jackets of the cables 104 engaging each other. Optionally, the cables 104 (for example, the jackets) may be at least partially compressed in the cable receptacle 140.

The clasp body 130 has an interior surface 142 facing the cable receptacle 140 and an exterior surface 144 opposite the interior surface 142. In an exemplary embodiment, the clasp body 130 has a low profile defined by a nominal thickness 146 of the clasp body 130 between the interior surface 142 and the exterior surface 144. The thickness 146 may be relatively thin, such as approximately equal to a thickness of cable jackets 148 of the cables 104; however other thicknesses are possible in alternative embodiments. Providing a low profile clasp body 130 allows for tight positioning of the cable arrays within the communication system 100. The low profile clasp body 130 does not appreciably or significantly affect the overall size of the cable bundles, which may allow tighter packaging of the cable arrays.

The upper locating member 132 includes an opening 150 therethrough providing access to the cable receptacle 140. The cable receptacle 140 receives the cables 104 through the opening 150. The opening 150 is defined by a first edge 152 and a second edge 154 that faces the first edge 152. The first and second edges 152, 154 are separated by a distance 156 slightly greater than a diameter of the cables 104. The upper locating member 132 may include a first flap 158 between the first edge 152 and the first end 136, and a second flap 160 between the second edge 154 and the second end 138. The first flap 158 may cover and retain any number of the cables 104 and the second flap 160 may cover and retain any number of the cables 104. Optionally, the first and second flaps 158, 160 may cover an equal number of cables 104. For example, the opening 150 may be approximately centered in the upper locating member 132. For example, an equal number of cables 104 may be loaded into the cable receptacle 140 to the left of the opening 150 and to the right of the opening 150. In an exemplary embodiment, the first edge 152 may at least partially cover and retain one of the cables 104 with a portion of such cable 104 exposed within the opening 150. The second edge 154 may at least partially cover and retain another of the cables 104 with a portion of such cable 104 exposed within the opening 150. As such, none of the cables 104 are completely uncovered by the upper locating member 132. In the illustrated embodiment, the lower locating member 134 is continuous and does not include any openings; however, the lower locating member 134 may include the opening 150 in alternative embodiments.

In an exemplary embodiment, the upper and lower locating members 132, 134 have a plurality of scallop-shaped projections 162, 164, respectively, with a series of cradles 166, 168 therebetween. The cradles 166, 168 are configured to receive corresponding cables 104 and hold the relative positions of the cables 104. Optionally, the cradles 166, 168 may be aligned with each other on opposite sides of the cable receptacle 140. The first and second ends 136, 138 define hook ends 136, 138 that form first and second cups 170, 172 that receive the outermost cables 104. The hook ends 136, 138 wrap entirely around the outermost cables 104 and cooperate with corresponding projections 162, 164 to hold the outermost cables 104 in the cable receptacle 140. The thickness 146 may be greater in the area of the projections 162, 164. The projections 162, 164 may have a complementary shape to the cables 104. The projections 162, 164 may have smooth continuous curves so the cable jackets 148 are not damaged by the cable management clasp 120.

In an exemplary embodiment, after the cables 104 are loaded into the cable management clasp 120, a secondary securing feature 174 may cover the opening 150 to secure the cables 104 within the cable receptacle 140. Optionally, the secondary securing feature 174 may be tape covering the opening 150. Optionally, the tape may wrap entirely around the exterior surface 144 of the cable management clasp 120. The tape may be thin so as to not increase the overall thickness or profile of the structure.

The cable management clasp 120 may be held on the cables 104 by frictional forces. For example, frictional forces generated between the interior surface 142 and the cable jackets 148 of the cables 104 may facilitate holding the cable management clasp 120 at a designated position along a length of the cable array. In some embodiments, the frictional forces may hold the cable management clasp 120 at a designated position, but such frictional forces may be overcome to permit a user to slide the cable management clasp 120 in either direction along the length of the cable array using a positioning force. For example, the user may grip the cable management clasp 120 and a portion of the cable array proximate to the cable management clasp 120 and pull or push the cable management clasp 120 along the cables 104. In some embodiments, the frictional forces may be so great that the cable management clasp 120 is not readily slidable along the length of the cable array. Optionally, the cable management clasp 120 may include a positioning feature, such as a barb or teeth, which engages the cables 104 to maintain the position of the cable management clasp 120 along the cables 104. In some embodiments, the cable management clasp 120 may enable positioning the cable array to locate twists of the cables 104 of the cable array at a particular location, such as closer to the contact module 110 or 112 (shown in FIG. 1) and away from a central location of the cable array. By positioning the twists closer to the contact module 110 or 112, the twists of at least some of the cable arrays may be more readily positioned within the communication system 100 for cable management.

Figure 3:
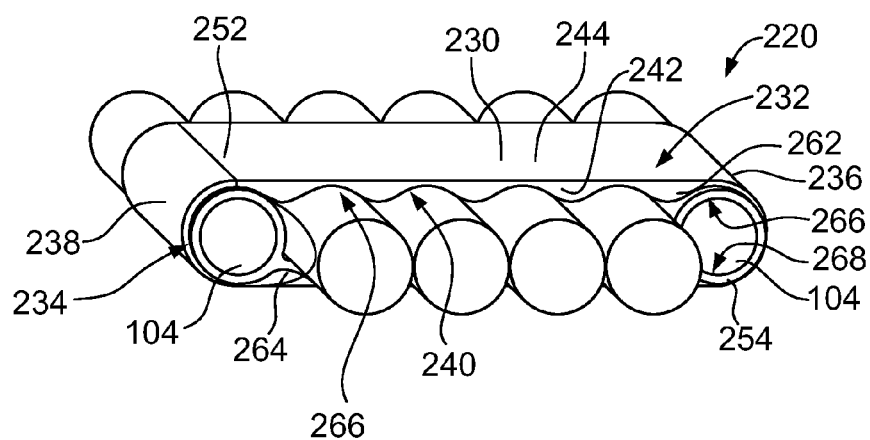
FIG. 3 is a top perspective view of a cable management clasp formed in accordance with an exemplary embodiment.

FIG. 3 is a top perspective view of a cable management clasp 220 in accordance with an exemplary embodiment. The cable management clasp 220 may be similar to the cable management clasp 120 in at least some respects; however the cable management clasp 220 is a two-piece structure. The cable management clasp 220 holds a plurality of the cables 104. The cable management clasp 220 includes a clasp body 230 having an upper locating member 232 and a lower locating member 234 joined to the upper locating member 232 at opposite first and second ends 236, 238. The upper locating member 232 is formed separate and discrete from the lower locating member 234 and is coupled thereto to form the clasp body 230. In an exemplary embodiment, the upper and lower locating members 232, 234 are identically formed such that the upper locating member 236 and the lower locating member 238 each form half of the clasp body 230. The upper and lower locating members 232, 234 may be molded from a plastic material. The upper and lower locating members 232, 234 may be flexible but able to generally retain their shape.

The upper and lower locating members 232, 234 are configured to be coupled together, such as end-to-end, to form an elongated cable receptacle 240 between the upper and lower locating members 232, 234. The upper and lower locating members 232, 234 gang a plurality of the cables 104 in a parallel arrangement within the cable receptacle 240. The upper locating member 232 spans above each of the cables 104 in the cable array. The lower locating member 234 spans below each of the cables 104 in the cable array. Optionally, during assembly, all of the cables 104 may be laid in the lower locating member 234 and then the upper locating member 232 may be coupled to the lower locating member 234 to capture the cables 104 therebetween, or vice versa.

The first and second ends 236, 238 define hook ends 236, 238 of the upper and lower locating members 232, 234 forming cups that wrap around the outermost cables 104. In an exemplary embodiment, the first end 236 is formed integral with the upper locating member 232 such that the upper locating member 232 has a J-shape. The second end 238 is formed integral with the lower locating member 234 such that the lower locating member 234 has a J shape.

The clasp body 230 has an interior surface 242 facing the cable receptacle 240 and an exterior surface 244 opposite the interior surface 242. The upper locating member 232 extends to a first mating end 252 opposite the first hook end 236 and the lower locating member 234 extends to a second mating end 254 opposite the second hook end 238. The second hook end 238 nests with the first mating end 252 and the second mating end 254 nests with the first hook end 236 to form a continuous clasp body 230 around the cables 104. The ends 236, 238, 252, 254 may include securing features, such as latches, clips, clasps, pads, adhesive, and the like for securing the upper and lower locating members 232, 234 together. Optionally, after the cables 104 are loaded into the cable management clasp 220, a secondary securing feature may cover the interfaces between the ends of the upper and lower locating members 232, 234 to secure the upper and lower locating members 232, 234 together. Optionally, the secondary securing feature may be tape wrapping entirely around the exterior surface of the cable management clasp 220.

In an exemplary embodiment, the upper and lower locating members 232, 234 have a plurality of scallop-shaped projections 262, 264, respectively, with a series of cradles 266, 268 therebetween. The cradles 266, 268 are configured to receive corresponding cables 104 and hold the relative positions of the cables 104. Optionally, the cradles 266, 268 may be aligned with each other on opposite sides of the cable receptacle 240.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A cable management clasp comprising
a clasp body having an upper locating member and a lower locating member joined to the upper locating member at opposite first and second ends, the upper and lower locating members being parallel to each other to form an elongated cable receptacle between the upper and lower locating members, the upper locating member including an opening therethrough providing access to the cable receptacle, the opening being defined by a first edge and a second edge, the first and second edges being separated by a distance slightly greater than a diameter of the cables, the cable receptacle receiving the cables through the opening, the first edge being configured to at least partially cover and retain a first cable of the cables, the second edge being configured to at least partially cover and retain a second cable of the cables, the upper and lower locating members ganging a plurality of cables in a parallel arrangement within the cable receptacle.

2. The cable management clasp of claim 1, wherein the upper and lower locating members have scallop-shaped projections extending into the cable receptacle and forming cradles for holding the relative positions of the cables.

3. The cable management clasp of claim 1, wherein the clasp body holds the cables tightly such that jackets of the cables engage each other.

4. The cable management clasp of claim 1, wherein the upper and lower locating members are molded from a plastic material.

5. The cable management clasp of claim 1, wherein the clasp body has a nominal thickness approximately equal to a thickness of jackets of the cables to define a low profile.

6. The cable management clasp of claim 1, wherein the upper and lower locating members and first and second ends are integrally formed as a single piece unitary structure.

7. A cable management clasp comprising
a clasp body having an upper locating member and a lower locating member integrally formed as a single piece unitary structure, the upper and lower locating members being joined at opposite first and second ends, the upper and lower locating members being parallel to each other to form an elongated cable receptacle between the upper and lower locating members, the upper locating member including an opening therethrough providing access to the cable receptacle, the cable receptacle receiving the cables through the opening, the upper and lower locating members ganging a plurality of cables in a parallel arrangement within the cable receptacle; and a tape wrapping around an exterior of the clasp body and covering the opening.

8. The cable management clasp of claim 1, wherein the upper locating member extends above each of the cables and the lower locating member extends below each of the cables.

9. A cable management clasp comprising an upper locating member having an interior surface and an exterior surface, the interior surface having a plurality of scallop-shaped projections forming a series of cradles, the cradles being configured to receive corresponding cables, the upper locating member having a first hook end forming a first cup configured to wrap around a first end cable of the cables such that the first hook end extends both above the first end cable and below the first end cable to retain the first end cable in the first hook end, the upper locating member having a first mating end opposite the first hook end;

a lower locating member having an interior surface and an exterior surface, the interior surface having a plurality of scallop-shaped projections forming a series of cradles, the cradles cooperating with the cradles of the upper locating member to receive corresponding cables, the lower locating member having a second hook end forming a second cup configured to wrap around a second end cable of the cables such that the second hook end extends both above the second end cable and below the second end cable to retain the second end cable in the second hook end, the lower locating member having a second mating end opposite the second hook end;

wherein the second hook end nests with the first mating end and the second mating end nests with the first hook end to form a continuous clasp body around the cables, the upper and lower locating members ganging the cables in a parallel arrangement with the cradles of the upper and lower locating members holding the relative positions of the cables.

10. The cable management clasp of claim 9, wherein the clasp body holds the cables tightly such that jackets of the cables engage each other.

11. The cable management clasp of claim 9, wherein the upper and lower locating members are molded from a plastic material.

12. The cable management clasp of claim 9, wherein the clasp body has a nominal thickness approximately equal to a thickness of jackets of the cables to define a low profile.

13. The cable management clasp of claim 9, wherein the upper locating member and the lower locating member are identically formed such that the upper locating member and the lower locating member each form half of the clasp body.

14. The cable management clasp of claim 9, wherein the upper locating member extends above each of the cables and the lower locating member extends below each of the cables.

15. The cable management clasp of claim 9, wherein the upper locating member is J-shaped and the lower locating member is J-shaped.

16. The cable management clasp of claim 9, wherein the cables are arranged along a cable plane, the upper locating member wrapping around the first end cable beyond the cable plane to a lower side of the first end cable, and wherein the lower locating member wraps around the second end cable beyond the cable plane to an upper side of the second end cable.

17. The cable management clasp of claim 7, wherein the opening is defined by a first edge and a second edge, the first and second edges being separated by a distance slightly greater than a diameter of the cables, the first edge being configured to at least partially cover and retain a first cable of the cables, the second edge being configured to at least partially cover and retain a second cable of the cables.

18. The cable management clasp of claim 7, wherein the clasp body holds the cables tightly such that jackets of the cables engage each other.

19. The cable management clasp of claim 7, wherein the clasp body has a nominal thickness approximately equal to a thickness of jackets of the cables to define a low profile.

20. The cable management clasp of claim 7, wherein the upper locating member extends above each of the cables and the lower locating member extends below each of the cables.

* * * * *